United States Patent
Kim et al.

(10) Patent No.: US 8,867,276 B2
(45) Date of Patent: Oct. 21, 2014

(54) MEMORY DEVICE HAVING THREE-DIMENSIONAL GATE STRUCTURE

(71) Applicant: Micron Technology, Inc., Boise, ID (US)

(72) Inventors: Nam-Kyeong Kim, Kyeonggi-do (KR); Jeong-Min Choi, Kyeonggi-do (KR)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/171,147

(22) Filed: Feb. 3, 2014

(65) Prior Publication Data

US 2014/0146614 A1     May 29, 2014

Related U.S. Application Data

(62) Division of application No. 12/869,569, filed on Aug. 26, 2010, now Pat. No. 8,642,442.

(51) Int. Cl.
| | | |
|---|---|---|
| H01L 27/115 | (2006.01) | |
| G11C 16/04 | (2006.01) | |
| G11C 16/10 | (2006.01) | |
| H01L 29/423 | (2006.01) | |
| H01L 29/788 | (2006.01) | |
| H01L 29/66 | (2006.01) | |
| H01L 29/792 | (2006.01) | |

(52) U.S. Cl.
CPC .... *H01L 27/11517* (2013.01); *H01L 29/42336* (2013.01); *H01L 29/7881* (2013.01); *H01L 27/11568* (2013.01); *H01L 29/66833* (2013.01); *H01L 29/66825* (2013.01); *H01L 27/11521* (2013.01); *G11C 16/0441* (2013.01); *G11C 16/0408* (2013.01); *H01L 29/792* (2013.01); *G11C 16/10* (2013.01)
USPC .................. 365/185.18; 365/185.33; 257/321

(58) Field of Classification Search
None
See application file for complete search history.

(56) References Cited

U.S. PATENT DOCUMENTS

| | | | |
|---|---|---|---|
| 8,642,442 B2 * | 2/2014 | Kim et al. | 438/424 |
| 2007/0267681 A1 | 11/2007 | Joo et al. | |
| 2008/0153227 A1 * | 6/2008 | Om et al. | 438/259 |

* cited by examiner

*Primary Examiner* — Seahvosh Nikmanesh
(74) *Attorney, Agent, or Firm* — Knobbe, Martens, Olson & Bear LLP

(57) ABSTRACT

Subject matter disclosed herein relates to a memory device, and more particularly to a nonvolatile memory device having a recess structure and methods of fabricating same.

20 Claims, 5 Drawing Sheets

MEMORY DEVICE HAVING THREE-DIMENSIONAL GATE STRUCTURE

REFERENCE TO RELATED APPLICATIONS

This application is a divisional of U.S. patent application Ser. No. 12/869,569, filed Aug. 26, 2010, now U.S. Pat. No. 8,642,442, entitled MEMORY DEVICE HAVING THREE-DIMENSIONAL GATE STRUCTURE, which is hereby incorporated herein by reference in its entirety and made part of this specification.

BACKGROUND

1. Field

Subject matter disclosed herein relates to a memory device, and more particularly to a nonvolatile memory device having a recess structure and methods of fabricating same.

2. Information

As the degree of integration of NAND flash memory increases, increasing effort may be directed to avoiding NAND cell deterioration while increasing NAND cell current. A decrease in cell current may result from a change in cell structure over time, where current flow areas of source and drain regions decrease. Moreover, such cell deterioration may lead to a substantial decrease in cell current which may in turn lead to erase-failure of the cell. Therefore, improving cell current while increasing the degree of integration of NAND flash memory has become an increasingly important goal.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
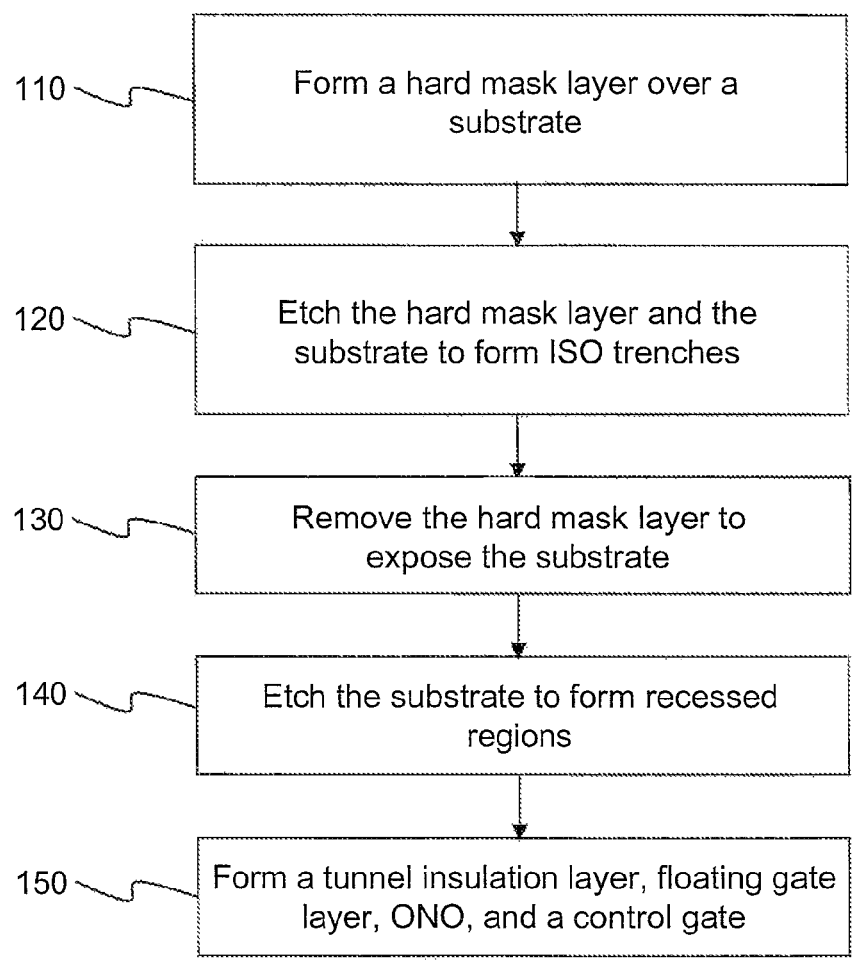
FIG. 1 is a flow diagram of a process for fabricating a memory device, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a flash memory device may comprise a three-dimensional gate structure including a relatively large area to provide improved current-carrying capacity for memory cell current. Such an improved current-carrying capacity may lead to improved reliability and/or stability of a flash memory device, for example. In particular, such a three-dimensional gate structure may comprise a U-shaped tunnel oxide layer disposed in a trench of an active region of a semiconductor substrate. Such a U-shaped tunnel oxide layer may be at least partially covered with a floating gate. In an implementation, at least a portion of such a U-shaped tunnel oxide and at least a portion of the floating gate may exist below a top surface of the semiconductor substrate, as discussed in detail below. Such portions of U-shaped tunnel oxide and floating gate may also exist below at least a portion of source/drain regions included in the semiconductor substrate. It should be noted that although terms "below", "top", "adjacent", "depth", "downward", "above", "over", and so on are used herein, it is understood that such terms do not necessarily refer to a direction defined by gravity or any other particular orientation. Instead, such terms are merely used to identify a position of one portion of a memory device relative to a position of another portion of the memory device in a particular context. In particular implementations, for example, a process of etching a semiconductor substrate may be performed from "above" a "top" surface of the substrate so that etching proceeds in a "downward" direction from the top surface to a particular "depth below" the top surface. Again, in such a description, such terms do not necessarily refer to a direction defined by gravity or any other particular orientation, but are merely relative terms made clear in the context in which they are used. Claimed subject matter is not limited to any particular direction or orientation.

In another embodiment, a flash memory device may further comprise floating gate polysilicon at least partially filling a U-shaped tunnel oxide, wherein at least a portion of the floating gate polysilicon and the U-shaped tunnel oxide exist below a portion of adjacent source/drain regions. Such a flash memory device, which may comprise a NAND flash memory device for example, may also comprise isolation-oxide regions that separate U-shaped tunnel oxide portions. Such isolation-oxide regions may, for example, comprise an oxide material providing electrical insulation between adjacent active regions of a substrate. In one implementation, such a flash memory device may further comprise an oxide-nitride-oxide (ONO) layer at least partially covering U-shaped tunnel oxide portions, isolation-oxide regions and source/drain regions, for example. A control gate may at least partially cover such an ONO layer, as described below. Of course, such details of a flash memory device are merely examples, and claimed subject matter is not so limited.

Figure 2:
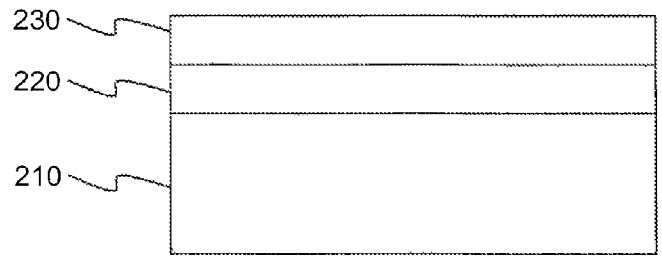
FIGS. 2-9 are cross-sectional views of a memory device, according to an embodiment.

In an embodiment, a process to fabricate a flash memory device comprising a three-dimensional gate structure may include forming trenches in active regions of a semiconductor substrate by etching the active regions using an isolation-oxide as an etch barrier (e.g., an etch mask), forming a tunnel oxide layer by conformally covering bottoms and sidewalls of the trenches, and at least partially filling the trenches with polysilicon to form floating gates. Before forming trenches in the active regions, such a fabrication process may further comprise forming a hard mask layer over the semiconductor substrate, forming isolation trenches by etching the hard mask layer and the semiconductor substrate to a particular depth, and at least partially filling the isolation trenches with an oxide layer to form the isolation-oxide. In one implementation, a process to fabricate a flash memory device may further comprise forming a planarized surface by chemical-mechanical polishing (CMP) the polysilicon and the isolation-oxide, and subsequently forming an oxide-nitride-oxide (ONO) layer over the planarized surface. A control gate may then be formed over the ONO layer, for example. Of course, such details of an example of flash memory device fabrication are merely examples, and claimed subject matter is not so limited FIG. 1 is a flow diagram of a process 100 for fabricating a memory device, and FIGS. 2-9 are schematic cross-sectional views of the memory device at various stages of fabrication process 100, according to an embodiment. Referring to FIG. 2 and block 110 of process 100, a hard mask layer may be deposited over a substrate 210. In one implementation, such a hard mask layer may comprise a first nitride layer 220 and a second nitride layer 230. For example, first nitride layer 220 may be used as a buffer during a CMP process. In one implementation, first nitride layer 220 may comprise a relatively soft material such as silicon nitride (SiN), though claimed subject matter is not so limited. Second nitride layer 230 may include a relatively smooth surface with relatively few or no defects at a silicon interface, for example. In one implementation, second nitride layer 230 may comprise $Si_3N_4$ and may be deposited using chemical vapor deposition (CVD) at relatively high temperature, though claimed subject matter is not so limited. Further, first and second nitride layers may be deposited using any of a number of deposition processes, such as chemical vapor deposition (CVD), molecular beam epitaxy (MBE), and atomic layer deposition (ALD), for example.

Figure 3:
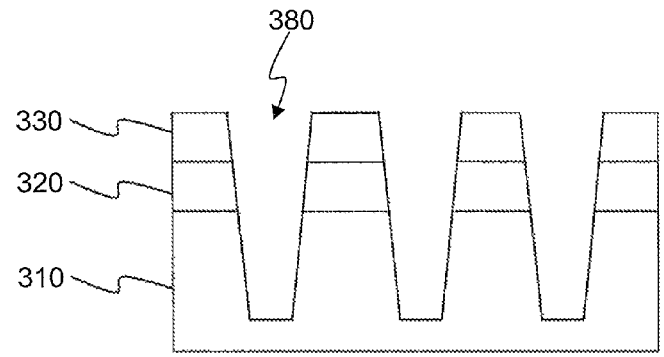
Figure 4:
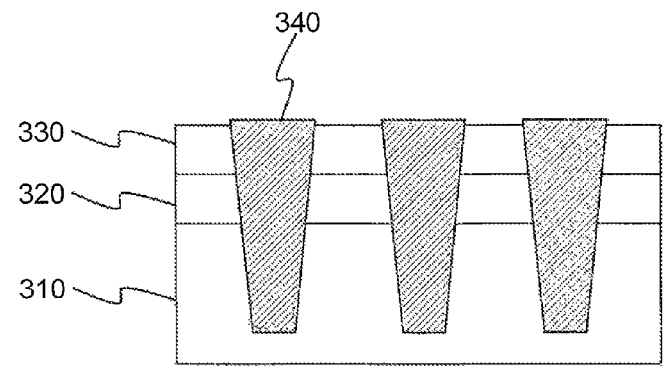

Referring to FIG. 3 and block 120 of process 100, first and second nitride layers (e.g., the hard mask layer) and a portion of substrate 210 may be etched to form trenches 380 having a particular depth in patterned substrate 310, patterned first nitride layer 320, and patterned second nitride layer 330. In an implementation, trenches 380 may be disposed in an isolation region, which may comprise a gap fill oxide. In particular, referring to FIG. 4, trenches 380 may be at least partially filled with an oxide to form isolation-oxide lines 340 using an oxidation process such as steam diluted oxidation, steam oxidation, LPRO, ISSG, and/or RTO, for example. Oxide materials may comprise any of a number of materials such as silicon oxide ($SiO_2$), silicon on glass (SOG), and so on.

Figure 5:
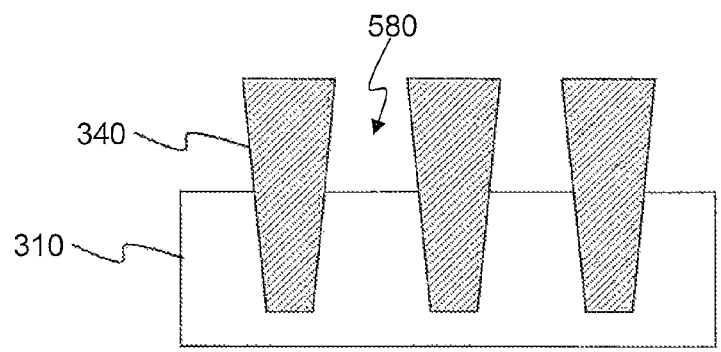
Figure 6:
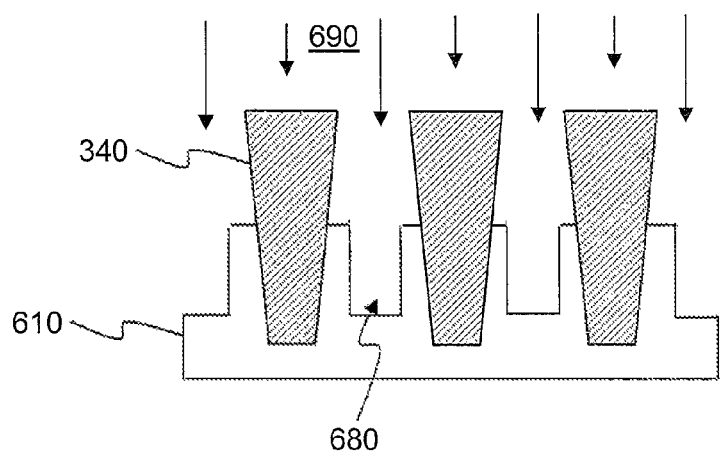

Referring to FIG. 5 and block 130 of process 100, the hard mask layer, including patterned first nitride layer 320 and patterned second nitride layer 330, may be removed by selectively etching the hard mask layer to expose patterned substrate 310 while allowing isolation-oxide lines 340 to remain. Such selective etching may be performed using a relatively strong anisotropic etching to etch substantially downward towards patterned substrate 310 (e.g., not laterally into sidewalls). Such selective etching may be performed using a dry etch process involving mixed gases such as argon, neon, oxygen, and carbon tetrafluoride ($CF_4$), just to name a few examples. Next, referring to FIG. 6 and block 140 of process 100, an etch process 690 may be applied via trenches 580 between adjacent isolation-oxide lines 340 to form recessed regions 680 in substrate 610. Such recessed regions may be formed in active regions of substrate 610, where source/drain regions may be formed in an earlier process (not shown), for example. Recessed regions 680 may comprise trenches having a particular depth as measured from the top surface of patterned substrate 610. Such recessed regions may be formed using etching processes described above, for example. Such a particular depth may be selected by adjusting the amount of time that substrate 610 is exposed to etching, for example. Accordingly, isolation-oxide lines 340 may be used in such an etch process as an etch barrier to allow formation of recessed regions 680 in active regions of substrate 610 while preventing the etch process from substantially removing substrate material from isolation regions of substrate 610.

Figure 7:
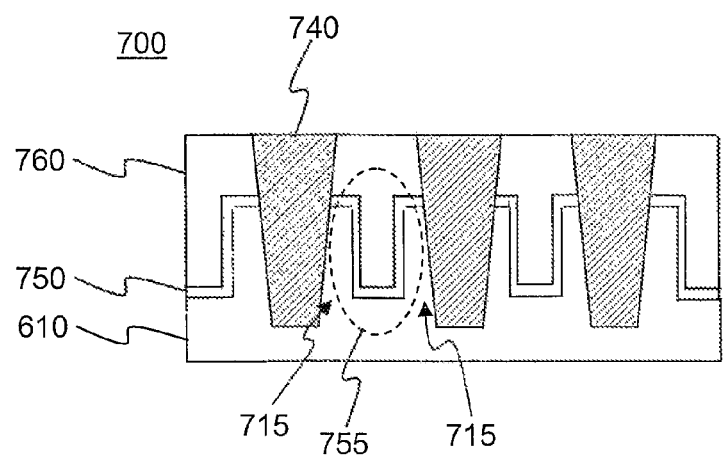
Figure 8:
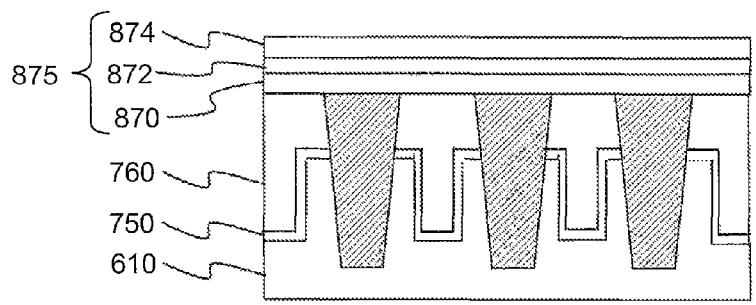
Figure 9:
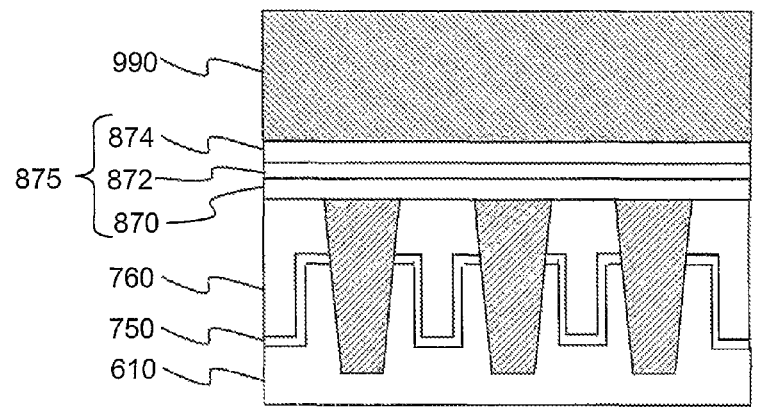

Referring to FIG. 7 and block 150 of process 100, subsequent to formation of recessed regions 680, a tunnel oxide layer 750 may be formed on substrate 610 to conformally cover bottoms and sidewalls of recessed regions 680. Such a tunnel oxide layer may be formed using a radical oxidation deposition technique, for example. In an implementation, tunnel oxide layer 750 may comprise a plurality of U-shaped tunnel oxide portions 755 between adjacent isolation-oxide portions 340. In particular, such tunnel oxide portions 755 may have, in cross-section, a substantially "U" shaped formation, conforming to bottoms and sidewalls of recessed regions 680. In an implementation, at least a portion of such a U-shaped tunnel oxide formation may exist below a top surface of substrate 610. As mentioned above, recessed regions 680 may be formed in a portion of substrate 610 comprising source/drain regions 715. Accordingly, tunnel oxide portions 755 may be adjacent to such source/drain regions. Next, recessed regions, which include tunnel oxide layer 750, may be at least partially filled with polysilicon to form floating gates 760. Such a filling process may be performed by depositing polysilicon using various techniques such as LPCVD, CVD, ALD and/or molecular beam epitaxy (MBE), for example, and doped in situ (e.g., during deposition) or implanted after deposition. Of course, such materials are merely examples, and claimed subject matter is not so limited.

In an embodiment, semiconductor structure 700, including isolation-oxide lines 340 and floating gates 760, may be planarized via chemical-mechanical polishing (CMP), for example. Subsequently, and oxide-nitride-oxide (ONO) layer 875 may be deposited on the planarized surface. In particular, such an ONO layer may comprise a blocking dielectric layer 870 (e.g., silicon oxide), a trapping dielectric layer 872 (e.g., silicon nitride), and a tunnel oxide layer 874 (e.g., silicon oxide). Of course, such materials are merely examples, and claimed subject matter is not so limited. Next, referring to FIG. 9, a control gate 990 comprising n-doped or p-doped polysilicon, for example, may be deposited to cover ONO layer 875. In one implementation, control gate 990 may be deposited using various techniques such as LPCVD, CVD, ALD and/or molecular beam epitaxy (MBE), for example, and doped in situ (e.g., during deposition) or implanted after deposition. Of course, such details regarding materials and techniques of depositing such materials are merely examples, and claimed subject matter is not so limited.

Figure 10:
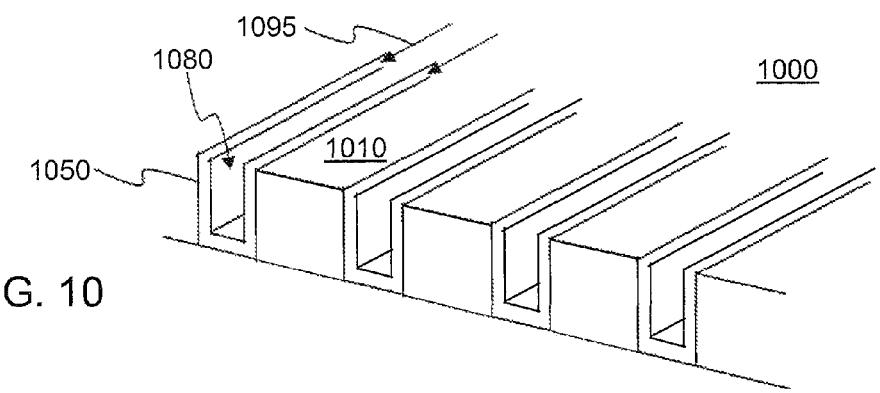
FIG. 10 is a perspective view of a memory device, according to an embodiment.

FIG. 10 is a schematic perspective view of a memory device 1000, according to an embodiment. In particular, memory device 1000 may comprise a flash memory device including a three-dimensional gate structure including a relatively large area to provide improved current-carrying capacity for memory cell current, indicated by arrows 1095 in FIG. 10. Here, for example, cell current 1095 may flow along tunnel oxide layer 1050, which at least partially covers sidewalls and/or bottoms of recessed regions 1080. Accordingly, such a three-dimensional gate structure may comprise a U-shaped tunnel oxide including a floating gate disposed in a trench of an active region of a semiconductor substrate 1010.

Figure 11:
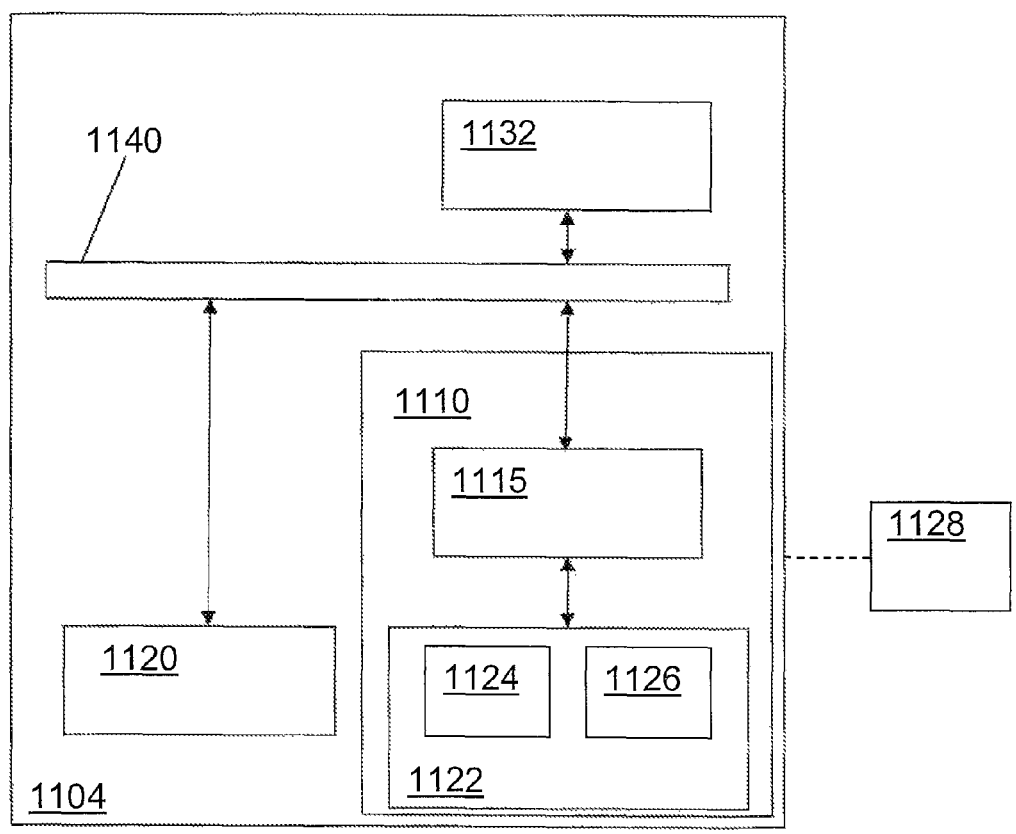
FIG. 11 is a schematic diagram of a computing system, according to an embodiment.

FIG. 11 is a schematic diagram illustrating an exemplary embodiment of a computing system 1100 including a memory device 1110. Such a computing device may comprise one or more processors, for example, to execute an application and/or other code. For example, memory device 1110 may comprise a three-dimensional gate structure including a relatively large surface area to provide improved current-carrying capacity for cell current, shown in FIG. 10. A computing device 1104 may be representative of any device, appliance, or machine that may be configurable to manage memory device 1110. Memory device 1110 may include a memory controller 1115 and a memory 1122. By way of example but not limitation, computing device 1104 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

In an embodiment, computing device 1104 may include at least one processing unit 1120 that is operatively coupled to memory 1122 through a bus 1140 and a host or memory controller 1115. Processing unit 1120 is representative of one or more circuits configurable to perform at least a portion of a data computing procedure or process. By way of example but not limitation, processing unit 1120 may include one or more processors, controllers, microprocessors, microcontrollers, application specific integrated circuits, digital signal processors, programmable logic devices, field programmable gate arrays, and the like, or any combination thereof. Processing unit 1120 may include an operating system configured to communicate with memory controller 1115. Such an operating system may, for example, generate commands to be sent to memory controller 1115 over bus 1140.

Memory 1122 is representative of any data storage mechanism. Memory 1122 may include, for example, a primary memory 1124 and/or a secondary memory 1126. Primary memory 1124 may include, for example, a random access memory, read only memory, etc. While illustrated in this example as being separate from processing unit 1120, it should be understood that all or part of primary memory 1124 may be provided within or otherwise co-located/coupled with processing unit 1120.

Secondary memory 1126 may include, for example, the same or similar type of memory as primary memory and/or one or more data storage devices or systems, such as, for example, a disk drive, an optical disc drive, a tape drive, a solid state memory drive, etc. In certain implementations, secondary memory 1126 may be operatively receptive of, or otherwise configurable to couple to, a computer-readable medium 1128. Computer-readable medium 1128 may include, for example, any medium that can carry and/or make accessible data, code, and/or instructions for one or more of the devices in system 1100.

Computing device 1104 may include, for example, an input/output 1132. Input/output 1132 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 1132 may include an operatively configured display, speaker, keyboard, mouse, trackball, touch screen, data port, etc.

In a particular embodiment, computing system 1100 may comprise a memory device including memory controller 1115 and a flash memory cell array, comprising recessed floating gates disposed in trenches of active regions of a semiconductor substrate, wherein at least a portion of the recessed floating gates are below a top surface of the semiconductor substrate. Computing system 1100 may further comprise processing unit 1120 to host one or more applications and to initiate commands to memory controller 1115 to provide access to memory cells in the flash memory cell array.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A memory device comprising:
   a plurality of recessed floating gates disposed in a corresponding plurality of trenches in a semiconductor substrate, wherein at least a portion of each of said plurality of recessed floating gates is below a top surface of said semiconductor substrate; and
   an isolation oxide between two adjacent recessed floating gates, said isolation oxide having a shape such that a top width of said isolation oxide is larger than a bottom width of said isolation oxide.

2. The memory device of claim 1, further comprising floating gate polysilicon at least partially filling said plurality of trenches, wherein at least a portion of said floating gate polysilicon is below said top surface of said semiconductor substrate.

3. The memory device of claim 1, wherein a top surface of said isolation oxide is above said top surface of said semiconductor substrate.

4. The memory device of claim 3, wherein a top surface of said floating gate polysilicon is above said top surface of said semiconductor substrate such that said top surface of said floating gate polysilicon is substantially co-planar with said top surface of said substantially isolation oxide.

5. The memory device of claim 1, further comprising a tunnel oxide on a bottom surface and side surfaces of said plurality of trenches.

6. The memory device of claim 1, wherein said tunnel oxide further covers at least a portion of said top surface of said substrate adjacent said plurality of trenches.

7. The memory device of claim 1, wherein said plurality of trenches is adjacent to corresponding source/drain regions of active regions of said semiconductor substrate.

8. The memory device of claim 1, further comprising an oxide-nitride-oxide (ONO) layer at least partially covering said plurality of recessed floating gates and said isolation-oxide.

9. The memory device of claim 8, further comprising a control gate at least partially covering said ONO layer.

10. The memory device of claim 1, wherein said memory device comprises a NAND flash memory device.

11. The memory device of claim 1, wherein said isolation oxide has a trapezoid shape.

12. A system comprising:
a memory cell array, wherein said memory cell array comprises:
- a plurality of recessed floating gates disposed in a corresponding plurality of trenches in active regions of a semiconductor substrate, wherein at least a portion of each of said plurality of recessed floating gates is below a top surface of said semiconductor substrate; and
- an isolation oxide between two adjacent recessed floating gates, said isolation oxide having a shape such that a top width of said isolation oxide is larger than a bottom width of said isolation oxide;

a memory controller configured to access said memory cell array; and a processor to host one or more applications and to initiate commands to said memory controller to provide access to said memory cell array.

13. The system of claim 12, wherein said memory cell array further comprises floating gate polysilicon at least partially filling said plurality of recessed floating gates, wherein at least a portion of said floating gate polysilicon is below said top surface of said semiconductor substrate.

14. The system of claim 12, wherein a top surface of said isolation oxide is above said top surface of said semiconductor.

15. The system of claim 14, wherein a top surface of said floating gate polysilicon is above said top surface of said semiconductor substrate such that said top surface of said floating gate polysilicon is substantially co-planar with said top surface of said isolation oxide.

16. The system of claim 12, wherein said memory cell array further comprises a tunnel oxide on a bottom surface and side surfaces of said plurality of trenches.

17. The system of claim 16, wherein said tunnel oxide is adjacent to source/drain regions of said semiconductor substrate.

18. The system of claim 12, wherein said memory cell array further comprises an oxide-nitride-oxide (ONO) layer at least partially covering said plurality of recessed floating gates and said isolation-oxide.

19. The system of claim 18, wherein said memory cell array further comprises a control gate at least partially covering said ONO layer, wherein said control gate comprises a control gate polysilicon.

20. The system of claim 12, wherein said memory cell array comprises a flash memory cell array.

* * * * *